United States Patent [19]

Weiner et al.

[11] Patent Number: 5,047,621
[45] Date of Patent: Sep. 10, 1991

[54] RADIAL TRANSMISSION LINE FOR WAVEFORM GENERATION AND POWER ACCUMULATION

[75] Inventors: Maurice Weiner, Ocean; Lawrence J. Bovino, Eatontown; Anderson H. Kim, Toms River, all of N.J.

[73] Assignee: The United States of America as represented by the Secretary of the Army, Washington, D.C.

[21] Appl. No.: 514,467

[22] Filed: Apr. 25, 1990

[51] Int. Cl.$^5$ ............................................. H01J 40/14
[52] U.S. Cl. .............................. 250/208.4; 250/208.6; 250/211 J
[58] Field of Search ............... 250/211 J, 208.6, 208.2, 250/208.4, 551; 357/30; 307/311, 117

[56] References Cited

U.S. PATENT DOCUMENTS

| | | | |
|---|---|---|---|
| 3,773,289 | 11/1973 | Gloge | 250/211 J |
| 3,777,150 | 12/1973 | Miller | 250/211 J |
| 4,157,926 | 6/1979 | Schoolar | 250/211 J |
| 4,301,362 | 11/1981 | Mourou | 250/211 J |
| 4,494,132 | 1/1985 | Kohn | 250/211 J |
| 4,691,111 | 9/1987 | Bovino | 250/211 J |

*Primary Examiner*—David C. Nelms
*Assistant Examiner*—Michael Messinger
*Attorney, Agent, or Firm*—Michael Zelenka; John M. O'Meara

[57] ABSTRACT

Waveform configuration and/or power accumulation are accomplished with a radial transmission line that includes a pair of electrodes. One electrode is segmented to have at least two independent sections disposed in radial sequence relative to an axis passing perpendicularly through the electrodes. Individual voltage levels are applied between each independent section and the other electrode, while optical switches are disposed between each radially adjacent pair of independent sections for controlling electrical conductivity therebetween. The magnitude of the individual voltages, as well as the phasing of the optical switches are determined in accordance with the desired waveform configuration and power level. For purposes of power accumulation only, a plurality of such radial transmission lines may be connected in series to a load through a coaxial waveguide, with each being arranged to generate the same waveform, while the waveform generated by each is delayed to enhance the cumulative waveform amplitude that passes thereto from the immediately preceding radial transmisison line in the conductive path to the load.

38 Claims, 3 Drawing Sheets

RADIAL TRANSMISSION LINE FOR WAVEFORM GENERATION AND POWER ACCUMULATION

The invention described herein may be manufactured, used, and licensed by or for the Government for governmental purposes without the payment to us of any royalties thereon.

BACKGROUND OF THE INVENTION

The present invention relates generally to the use of optical switches in transmission lines which apply signal waveforms to loads and more particularly, to radial transmission lines that derive waveform configurations and/or accumulate power.

Optical switches such as those comprised of bulk semiconductor material having metal electrodes disposed thereon, are well known in the electro-optic arts. The semiconductor material is highly resistive (greater than 10,000 ohm-centimeters) and therefore, conducts no appreciable current from a voltage source connected across the metal electrodes, until optical radiation or light is directed upon the inter-electrode region thereon. Of course, when light is so directed, the semiconductor material becomes conductive with incredible speed and if such light delivers sufficient energy, the switching will occur in nearly zero time because electronic-hole pairs or carriers throughout the semiconductor material will be instantaneously set into motion. Limitations do exist in this regard, such as when the source of light is a laser of typical pulsewidth, a risetime of picoseconds will be encountered in reaching the conductive state. Such high speed results in low pulse jitter and makes it possible to precisely sequence a multiple switch arrangement. Furthermore, optical switches provide advantages other than speed, such as control signal isolation which avoids problems with signal or pulse fidelity and high voltage transients.

SUMMARY OF THE INVENTION

It is the general object of the present invention to provide a radial transmission line for configuring signal waveforms and/or accumulating power from a plurality of voltage sources.

It is a specific object of the present invention to utilize the radial transmission line of the above-stated general object in plurality to accumulate the power of individual signal waveform configurations.

These and other objects are accomplished in accordance with the present invention wherein each radial transmission line has a pair of electrodes separated along an axis with one electrode being segmented to have at least two independent sections disposed in radial sequence relative to that axis. Optical switches are disposed between the adjacent independent sections to provide an electrically conductive path therebetween, when light is directed upon those switches. Signal waveforms are configured in accordance with the individual voltage levels applied to the independent sections, while power accumulation is accomplished by applying light simultaneously to the optical switches. Power accumulation relative to a signal waveform of particular configuration is accomplished with a plurality of radial transmission lines disposed along an axis, by applying the required voltage levels for that configuration to each radial transmission line and phasing the light applied to the optical switches of individual transmission lines in accordance with the distance separating those transmission lines, to conduct the contributions thereof in phase along the axis.

The scope of the present invention is only limited by the appended claims for which support is predicated on the preferred embodiments hereinafter set forth by the following description and the attached drawings wherein like reference characters related to like parts throughout the several figures.

DESCRIPTION OF THE PREFERRED EMBODIMENTS

Figure 1:
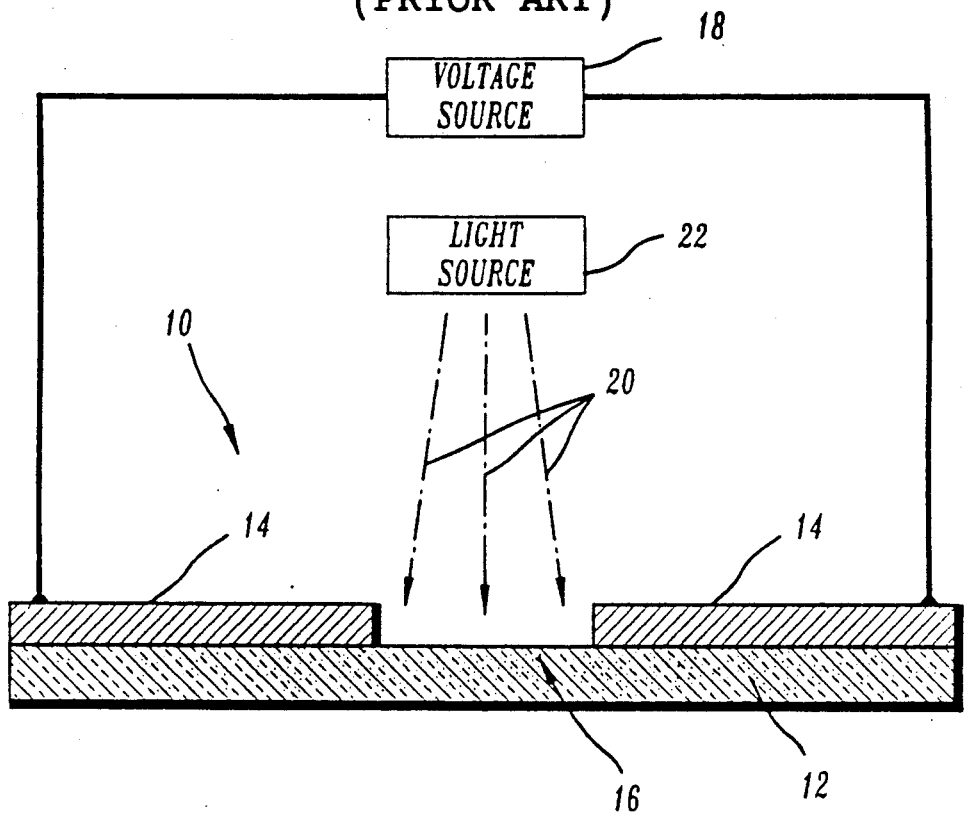
FIG. 1 is a block diagram representation of a conventional optical switch, showing the structural and operational aspects thereof.

As illustrated in FIG. 1, the structure for one type of conventional optical switch 10 includes a piece of semiconductor material 12 such as semi-insulating gallium arsenide or silicon on which electrically conductive electrodes 14 are disposed with an inter-electrode region 16 separating therebetween. Of course, the semiconductor material 12 normally presents a very high resistance to electrical flow, such as when a voltage source 18 is applied across the electrodes 14. However, when optical radiation 20, such as visible light from a source 22, is directed upon the inter-electrode region 16, the resistance of the semiconductor material becomes very low and significant current will flow from the voltage source 18.

Figure 2:
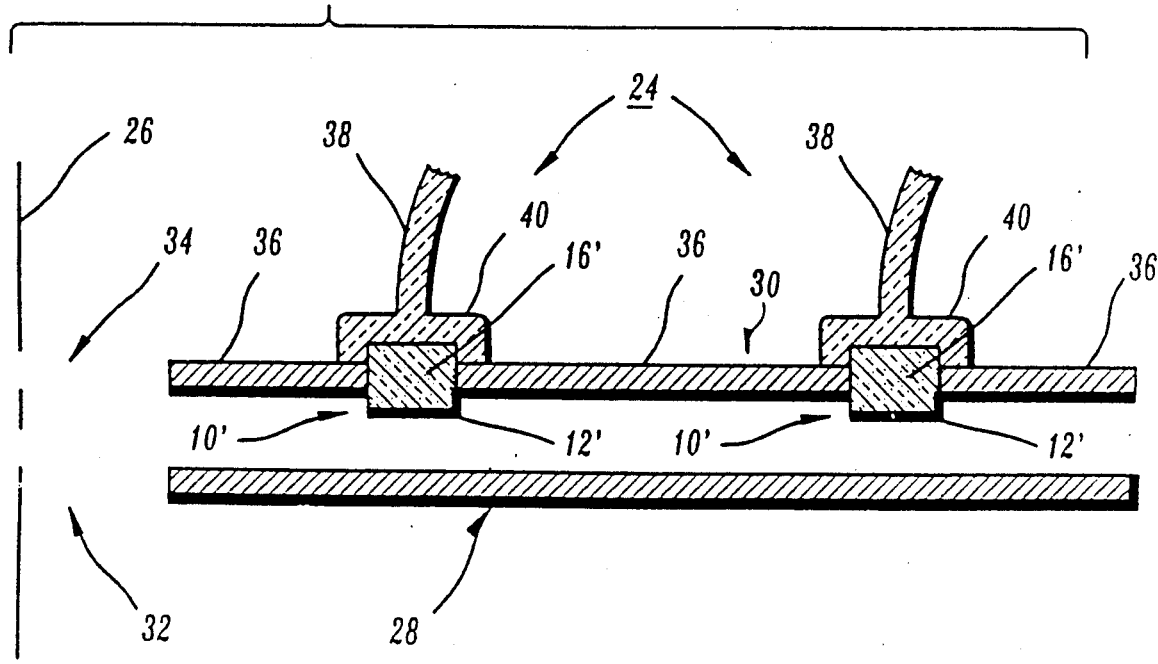
FIG. 2 is a sectional view taken through a portion of a radial transmission line embodiment of the invention.

Only a portion of a radial transmission line 24 in accordance with this invention is shown on one side of an axis 26 in FIG. 2 wherein optical switches 10' similar to the type illustrated in FIG. 1 are included. A common electrode 28 and a segmented electrode 30 are separated along the axis 26 and each of the electrodes 28 and 30 has an aperture 32 and 34 respectively, disposed therethrough along the axis 26. The segmented electrode 30 has at least two independent sections 36 disposed in radial sequence relative to the axis 26 and at least one optical switch 10' is disposed between each radially adjacent pair of independent sections 36 to provide an electrically conductive path therebetween, when optical radiation is directed upon the switches 10'.

Figure 3:
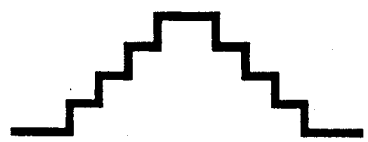
FIG. 3 is the unipolar waveform profile that is generated with one embodiment of the invention.
Figure 4:
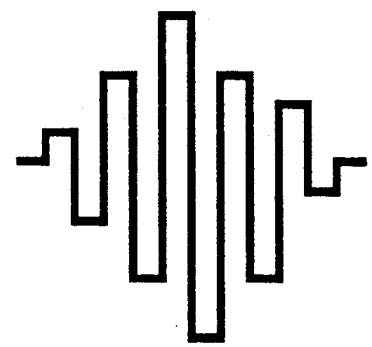
FIG. 4 is the bipolar waveform profile that is generated with another embodiment of the invention.

Signal waveforms or pulses of particular configuration are available across the electrodes 28 and 30 from locations about the periphery of each aperture 32 and 34. The configuration of such waveforms is determined in accordance with the parameters of the individual voltages (not shown) applied between the common electrode 28 and each independent section 36, as well as the phasing pattern utilized to direct optical radiation upon the inter-electrode region 16 of each switch 10'. When such individual voltages all have the same polarity, the waveform configuration derived is that of a unipolar pulse having a duration equal to the roundtrip transit time of the radial transmission line 24, as illustrated in FIG. 3. However, if the alternate independent sections 36 have individual voltages of opposite polarity applied thereto, the waveform configuration derived is an alternating or bipolar square wave having a period equal to the round trip transit time divided by the applicable number of independent sections 36 to which the individual voltages are applied, as illustrated in FIG. 4. Optical radiation may be directed simultaneously upon the inter-electrode regions 16 of all the switches 10' when deriving either the unipolar pulse or bipolar square wave to accumulate the power available between the independent sections 36 at the greatest radial distance from the axis 26 and the independent sections 36 at the least radial distance therefrom. Furthermore, a waveform of uniform amplitude may be derived by progressively increasing the magnitude of the individual voltages as the independent sections 36 are located closer to the axis 26.

Although the radial transmission line 24 will function well when only air is disposed in the space separating the electrodes 28 and 30 along the axis 26, a dielectric material may be disposed therein, if so desired. Furthermore, the optical radiation 20 may be conveyed to each of the switches 10' through an optical fiber 38. Sufficient energy for attaining picosecond response times with the switches 10' may be obtained by incorporating at least one mode locked laser as the source 22. If only nanosecond response time is required with the switches 10', sufficient energy may be obtained by incorporating at least one Q-switch laser as the source 22. Lasers of the mode locked and Q-switch types are well known in the optical arts, as are homogenizers 40 through which the optical radiation 20 may be directed to the switches 10' for uniformly distributing the radiation 20 over the inter-electrode region 16' thereon.

Figure 5:
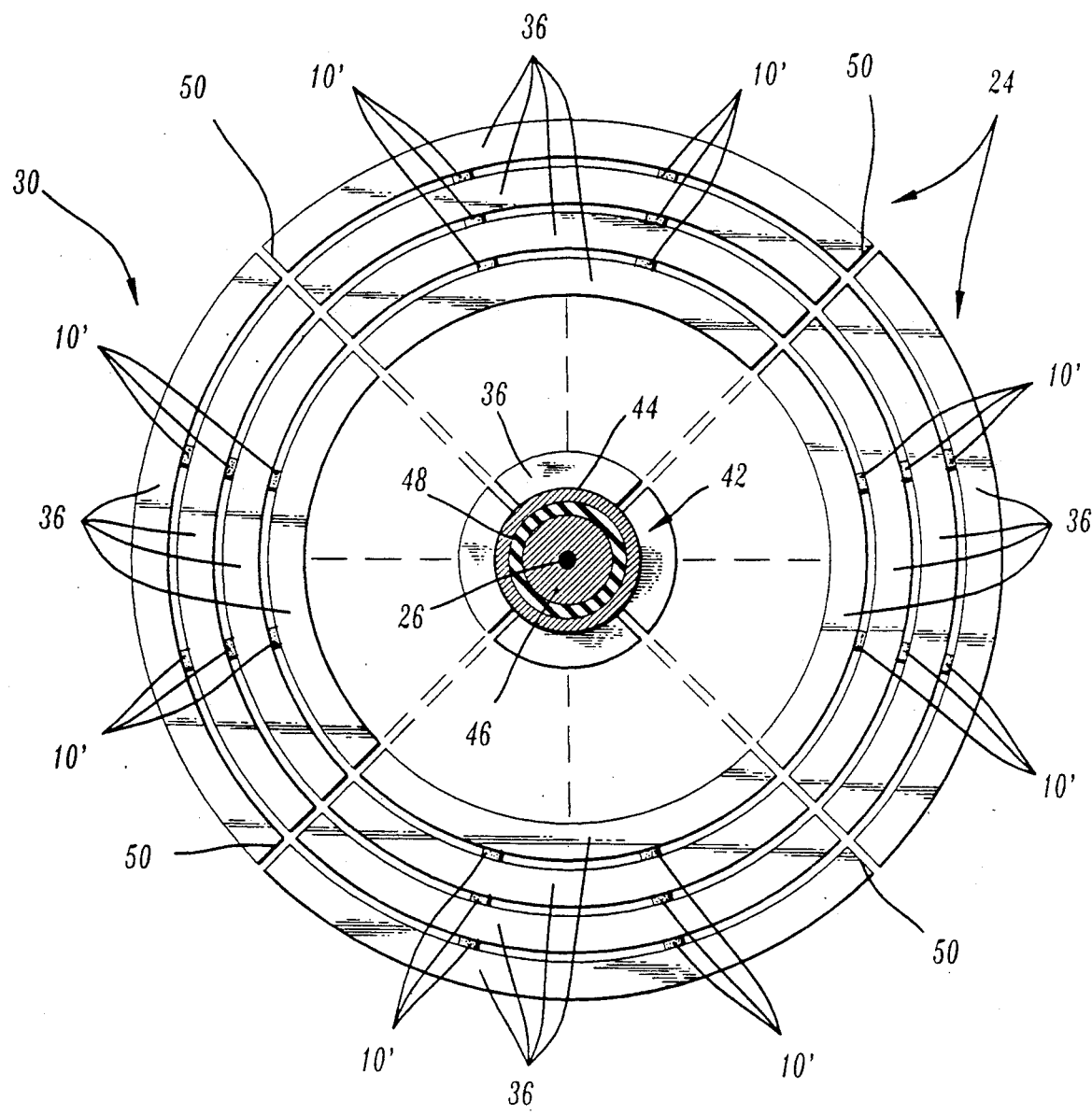
FIG. 5 is an end view along the axis of a radial transmission line in accordance with the invention.

As shown in FIG. 5, the radial transmission line 24 may be connected to a load (not shown) through a waveguide 42, such as a cable having a shield conductor 44 and a center conductor 46 separated by electrically insulating material 48 and coaxially aligned therein. Although only the segmented electrode 30 appears in FIG. 5, the conductors 44 and 46 are electrically connected separately to the electrodes 28 and 30. The electrical connection to the segmented electrode 30 is made between the shield conductor 44 and the innermost independent section 36, while the center conductor 46 is electrically connected to the common electrode 28. Of course, these electrical connections are a matter of design preference and therefore, the segmented electrode 30 could connect to the center conductor 46 and then the common electrode 28 would connect to the shield conductor 44. Otherwise, to preclude the flow of current circularly about the axis 26, each independent section 36 is made discontinuous thereabout by cutting at least one slot 50 therethrough to interrupt the electrical continuity therearound. These slots 50 are not absolutely essential to the radial transmission line 24 of the invention, but may extend in directions other than that shown in FIG. 5, where each slot 50 extends perpendicularly relative to the axis 26. It should be noted in FIG. 5 that a plurality of independent sections 36 may be located at the same radial distance from the axis 26 over the full surface of the segmented electrode 30, due to the slots 50.

Figure 6:
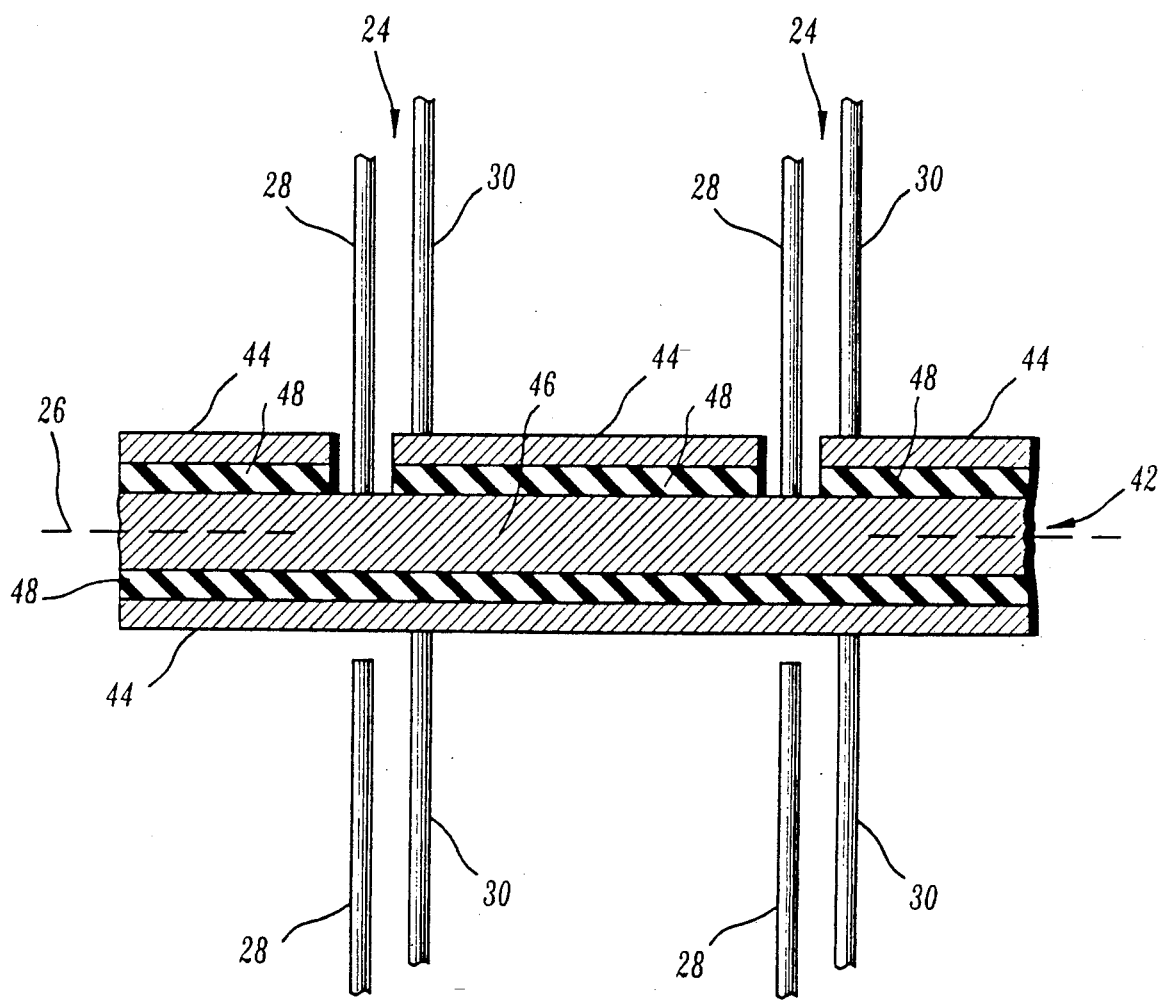
FIG. 6 is a plan view showing a plurality of radial transmission lines in accordance with the invention, which individually generate waveforms of identical configuration and are spaced along a waveguide to accumulate power in that waveform configuration.

Pulse power accumulation may also be accomplished by disposing a plurality of radial transmission lines 24 along the length of a single waveguide 42, as shown in FIG. 6. In this embodiment, adjacent radial transmission lines 24 are separated by the same distance along the length of the waveguide 42. Substantially identical pulse waveforms are derived from each of the radial transmission lines 24 by applying the same voltage magnitude between the common electrode 28 and each independent section 36 on the individual radial transmission lines 24 while activating the optical switches 10' of each radial transmission line 24 in the same sequence. Activation of the optical switches 10' in adjacent radial transmission lines 24 is delayed by a time duration equal to the distance therebetween divided by the velocity of the identical pulse waveforms. A pulse waveform is thereby derived at the location of each radial transmission line 24 on the waveguide 42, which has a magnitude equal to the cumulative sum of all the pulse waveform magnitudes up to and including that radial transmission line 24. Of course, both the shield and center conductors 44 and 46 respectively, must be electrically continuous throughout the length of the waveguide 42. Therefore, to avoid design complications in the FIG. 6 embodiment of the invention, each common electrode 28 only makes electrical contact intermittently about the periphery of the center conductor 46 of the coaxial cable 42. Although the segmented electrode 30 is shown to only make electrical contact intermittently about the periphery of the shield conductor 44 in FIG. 6, such contact could be about the full periphery thereof.

Those skilled in the art will appreciate without any further explanation that within the radial transmission line concept of this invention, many modifications and variations are possible to the above disclosed embodiments. Consequently, it should be understood that all such modifications and variations fall within the scope of the following claims.

What we claim is:

1. A radial transmission line for generating a waveform, comprising:
   a common electrode and a segmented electrode separated along an axis, each said electrode having an aperture disposed therethrough along said axis, said segmented electrode having at least two independent sections disposed in radial sequence relative to said axis; and
   at least one piece of semiconductor material disposed between each radially adjacent pair of said independent sections to provide an electrically conductive path therebetween when optical radiation is directed upon said pieces of semiconductor material;
   the waveform being available from across said electrodes at locations on the periphery of each said aperture therein and being configured in accordance with individual voltages applied between said common electrode and each said independent section, as well as the phasing of optical radiation on said pieces of semiconductor material.

2. The radial transmission line of claim 1 wherein dielectric material is disposed between said electrodes along said axis.

3. The radial transmission line of claim 1 wherein the waveform generated thereby is coupled to a load through a waveguide.

4. The radial transmission line of claim 3 wherein said waveguide is a coaxial cable.

5. The radial transmission line of claim 1 wherein said independent sections are discontinuous about said axis to preclude the flow of current circularly thereabout.

6. The radial transmission line of claim 5 wherein the discontinuous portions of said independent sections extend perpendicularly relative to said axis.

7. The radial transmission line of claim 1 wherein individual voltages of the same polarity are applied between said common electrode and said independent sections to derive a unipolar waveform.

8. The radial transmission line of claim 7 wherein optical radiation is simultaneously applied on all said pieces of semiconductor material to accumulate the power available between said independent sections at the greatest radial distance from said axis and said independent sections at the least radial distance from said axis.

9. The radial transmission line of claim 1 wherein individual voltages of opposite polarities are applied between said common electrode and said radially adjacent independent sections to derive a bipolar waveform.

10. The radial transmission line of claim 9 wherein optical radiation is simultaneously applied on all said pieces of semiconductor material to accumulate the power available between said independent sections at the greatest radial distance from said axis and said independent sections at the least radial distance from said axis.

11. The radial transmission line of claim 1 wherein the individual voltages are progressively increased as said independent sections are located closer to said axis, to derive a waveform of uniform amplitude.

12. The radial transmission line of claim 11 wherein optical radiation is simultaneously applied on all said pieces of semiconductor material to accumulate the power available between said independent sections at the greatest radial distance from said axis and said independent sections at the least radial distance from said axis.

13. The radial transmission line of claim 1 wherein optical radiation is conveyed to each said piece of semiconductor material through an optical fiber.

14. The radial transmission line of claim 1 wherein optical radiation is uniformly distributed on each said piece of semiconductor material by a homogenizer.

15. The radial transmission line of claim 1 wherein at least one laser directs optical radiation to said pieces of semiconductor material.

16. The radial transmission line of claim 15 wherein each said laser is of the mode locked type for delivering sufficient energy to attain picosecond response in said pieces of semiconductor material.

17. The radial transmission line of claim 15 wherein each said laser is of the Q-switch type for delivering sufficient energy to attain nanosecond response in said pieces of semiconductor material.

18. The radial transmission line of claim 15 wherein the optical radiation is conveyed to each said piece of semiconductor material through an optical fiber and is uniformly distributed thereon by a homogenizer.

19. A transmission line for applying signal waveforms to a load, comprising:
 a waveguide having an axis along which it extends to the load;
 at least one radial transmission line, each said radial transmission line including a common electrode and a segmented electrode which are separated along said axis, each said electrode having an aperture disposed therethrough along said axis, said segmented electrodes having at least two independent sections disposed in radial sequence relative to said axis; and
 at least one optical switch disposed between each radially adjacent pair of said independent sections to provide an electrically conductive path therebetween when optical radiation is applied to said switches;
 the signal waveforms being applied to said waveguide from across said electrodes at locations on the peripheries of said apertures therein and being configured in accordance with individual voltages applied between said common electrode and each said independent section, as well as the phasing of optical radiation on said switches.

20. The transmission line of claim 19 wherein dielectic material is disposed along said axis between said electrodes of each said radial transmission line.

21. The transmission line of claim 19 wherein said waveguide is a coaxial cable.

22. The transmission line of claim 19 wherein said independent sections are discontinuous about said axis to preclude the flow of current circularly thereabout.

23. The transmission line of claim 22 wherein the discontinuous portions of said independent sections extend perpendicularly relative to said axis.

24. The transmission line of claim 19 wherein optical radiation is conveyed to each said switch in said radial transmission lines through an optical fiber.

25. The transmission line of claim 19 wherein optical radiation is uniformly distributed on each said switch in said radial transmission lines by a homogenizer.

26. The transmission line of claim 19 wherein at least one laser directs optical radiation to said switches in each said radial transmission line.

27. The transmission line of claim 26 wherein each said laser is of the mode locked type for delivering sufficient energy to attain picosecond response in said switches.

28. The transmission line of claim 26 wherein each said laser is of the Q-switch type for delivering sufficient energy to attain nanosecond response in said switches.

29. The transmission line of claim 26 wherein the optical radiation is conveyed to each said switch through an optical fiber and is uniformly distributed thereon by a homogenizer.

30. The transmission line of claim 19 wherein optical radiation is simultaneously applied on said switches of each said radial transmission line to connect the voltages applied thereto in parallel and thereby accumulate the power available therefrom.

31. The transmission line of claim 19 wherein individual voltages of the same polarity are applied between said common electrode and said independent sections of each said radial transmission line to derive a unipolar waveform therefrom.

32. The transmission line of claim 31 wherein optical radiation is simultaneously applied on said switches of each said radial transmission line to connect the voltages applied thereto in parallel and thereby accumulate the power available therefrom.

33. The transmission line of claim 19 wherein individual voltages of opposite polarities are applied between said common electrode and said radially adjacent independent sections of each said radial transmission line to derive a bipolar waveform therefrom.

34. The transmission line of claim 33 wherein optical radiation is simultaneously applied on said switches of each said radial transmission line to connect the voltages applied thereto in parallel and thereby accumulate the power available therefrom.

35. The transmission line of claim 19 wherein the individual voltages for each said radial transmission line are progressively increased as said independent sections therein are located closer to said axis, to derive a waveform with uniform amplitude therefrom.

36. The transmission line of claim 35 wherein optical radiation is simultaneously applied on said switches of each said radial transmission line to connect the voltages applied thereto in parallel and thereby accumulate the power available therefrom.

37. The transmission line of claim 19 wherein each said switch includes a piece of semiconductor material which becomes electrically conductive when optical radiation is directed thereupon.

38. The transmission line of claim 19 wherein a plurality of said radial transmission lines are separated along said axis by a uniform distance to accumulate power relative to a particular waveform configuration, each said radial transmission line having the magnitudes of its individual voltages and the phasing of its optical radiation determined to substantially generate the particular waveform configuration, with the phasing of its optical radiation being initiated with a delay relative to its adjacent radial transmission line in a direction opposite that of conduction to the load by a time duration equal to the uniform distance divided by the velocity of the particular waveform, the magnitude of power accumulated in said waveguide at any radial transmission line location being equal to the sum of the power magnitudes generated by said radial transmission lines on said waveguide up to and including that location in the direction of waveform conductivity to the load.

* * * * *